(12) United States Patent
Dietze et al.

(10) Patent No.: US 11,567,565 B2
(45) Date of Patent: Jan. 31, 2023

(54) SENSOR AND USE OF A SENSOR IN A 3-D POSITION DETECTION SYSTEM

(71) Applicant: OSRAM OLED GmbH, Regensburg (DE)

(72) Inventors: Daniel Dietze, Regensburg (DE); Maximilian Assig, Regensburg (DE); Claus Jaeger, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 407 days.

(21) Appl. No.: 16/647,193

(22) PCT Filed: Sep. 21, 2018

(86) PCT No.: PCT/EP2018/075622
§ 371 (c)(1),
(2) Date: Mar. 13, 2020

(87) PCT Pub. No.: WO2019/057903
PCT Pub. Date: Mar. 28, 2019

(65) Prior Publication Data
US 2020/0225740 A1  Jul. 16, 2020

(30) Foreign Application Priority Data
Sep. 22, 2017 (DE) .................. 102017122030.5

(51) Int. Cl.
*G06F 3/01* (2006.01)
*G01S 1/70* (2006.01)
(Continued)

(52) U.S. Cl.
CPC ............. *G06F 3/012* (2013.01); *G01S 1/703* (2019.08); *G01S 3/789* (2013.01); *G06T 19/00* (2013.01)

(58) Field of Classification Search
CPC ........ G06F 3/011; G06F 3/012; G06F 3/0304; G06F 3/013; G06F 3/0346; G02B 27/017;
(Continued)

(56) References Cited

U.S. PATENT DOCUMENTS 6,462,330 B1 * 10/2002 Venkat .................. G06F 3/0317
257/E31.127
9,318,357 B2    4/2016 Brandl et al.
(Continued)

FOREIGN PATENT DOCUMENTS

| DE | 102008010512 A1 | 8/2009 |
|---|---|---|
| DE | 102012109905 A1 | 4/2014 |
| EP | 1383175 A1 | 1/2004 |

OTHER PUBLICATIONS

Zhu Zhao, et al. "Optics Communications; Centroid shift analysis of microlens array detector in interference imaging system," Journal Homepage: www.elsevier.com/locate/optcom, Optics Communications 354 (2015), pp. 132-139.

*Primary Examiner* — Olumide Ajibade Akonai
(74) *Attorney, Agent, or Firm* — Slater Matsil, LLP

(57) ABSTRACT

A sensor and a 3-D position detection system are disclosed. In an embodiment a sensor includes at least one sensor chip configured to detect radiation, at least one carrier on which the sensor chip is mounted and a cast body that is transmissive for the radiation and that completely covers the sensor chip, wherein a centroid shift of the sensor chip amounts to at most 0.04 mrad at an angle of incidence of up to at least 60°, wherein the cast body comprises a light inlet side that faces away from the sensor chip, and the light inlet side comprises side walls bounding it on all sides, wherein the side walls are smooth, planar and transmissive for the radiation, wherein a free field-of-view on the light inlet side (Continued)

has an aperture angle of at least 140°, and wherein the cast body protrudes in a direction away from the sensor chip beyond a bond wire.

18 Claims, 16 Drawing Sheets

(51) Int. Cl.
*G01S 3/789* (2006.01)
*G06T 19/00* (2011.01)

(58) Field of Classification Search
CPC . G01S 1/06; G01S 11/06; G01S 15/89; G01S 5/02; G01S 5/0221; G01S 5/0284; G01S 1/703; G01S 3/789; G01S 3/781; G01S 1/70; G06T 19/00; H01L 31/0203
See application file for complete search history.

(56) References Cited

U.S. PATENT DOCUMENTS

| | | | |
|---|---|---|---|
| 2004/0041282 A1* | 3/2004 | Kinsman | H01L 27/14634 |
| | | | 257/796 |
| 2015/0270243 A1* | 9/2015 | Yang | H01L 23/49827 |
| | | | 438/118 |
| 2016/0033768 A1* | 2/2016 | Pedrotti | G02B 27/0149 |
| | | | 345/8 |
| 2016/0131761 A1 | 5/2016 | Yates et al. | |
| 2017/0263058 A1* | 9/2017 | Muta | A63F 13/525 |
| 2017/0287194 A1* | 10/2017 | Katz | G02B 27/017 |
| 2018/0267601 A1* | 9/2018 | Yoon | G06F 3/011 |
| 2018/0357747 A1* | 12/2018 | Young | G06T 7/70 |

* cited by examiner

FIG 12A $$d_0 = L \sin \alpha$$
$$d' = L \cos\alpha - h$$
$$\beta = \sin^{-1} \frac{\sin(\alpha+\delta)}{n}$$
$$d_1 = L' \tan(\alpha+\delta)$$
$$d_2 = h' \tan \beta$$

$$\Delta = d_1 + d_2 - d_0 \equiv \Delta(h', n)$$

FIG 12B

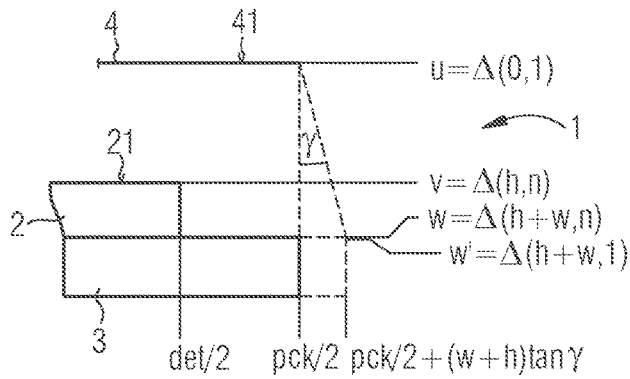

FIG 12C $$S(\delta) = \begin{cases} T(\alpha+\delta) \text{ für } -det/2 < v < det/2 & (i) \\ \eta_{pcb} T(\alpha+\delta) \text{ für } -pck/2 < w < -det/2 \text{ oder } det/2 < w < pck/2 \text{ und nicht in } (i) & (ii) \\ \eta_{sw} T(90°-\alpha-\delta-\gamma) \text{ für } u > pck/2 \text{ und } w' < pck/2 + (w+h)\tan\gamma \text{ und nicht in } (ii) & (iii) \end{cases}$$

FIG 12D $$T(\theta) = 1 - \frac{R_s(\theta) + R_p(\theta)}{2} \quad \begin{cases} R_p(\theta) = \left|\frac{\cos\phi - n\cos(\theta)}{\cos\phi + n\cos(\theta)}\right|^2 \\ R_s(\theta) = \left|\frac{\cos(\theta) - n\cos\phi}{\cos(\theta) + n\cos\phi}\right|^2 \end{cases} \phi = \sin^{-1}\frac{\sin(\theta)}{n}$$

FIG 12E $$\eta_{sw} = \eta_{sw}^0 \left(\frac{det}{pck}\right)\left(\frac{h}{h+w}\right)$$

| det | mm | 1.0 |
| pck | mm | 1.3 |
| γ | ° | 10 |
| h | μm | 150 |
| w | μm | 300 |

FIG 14E
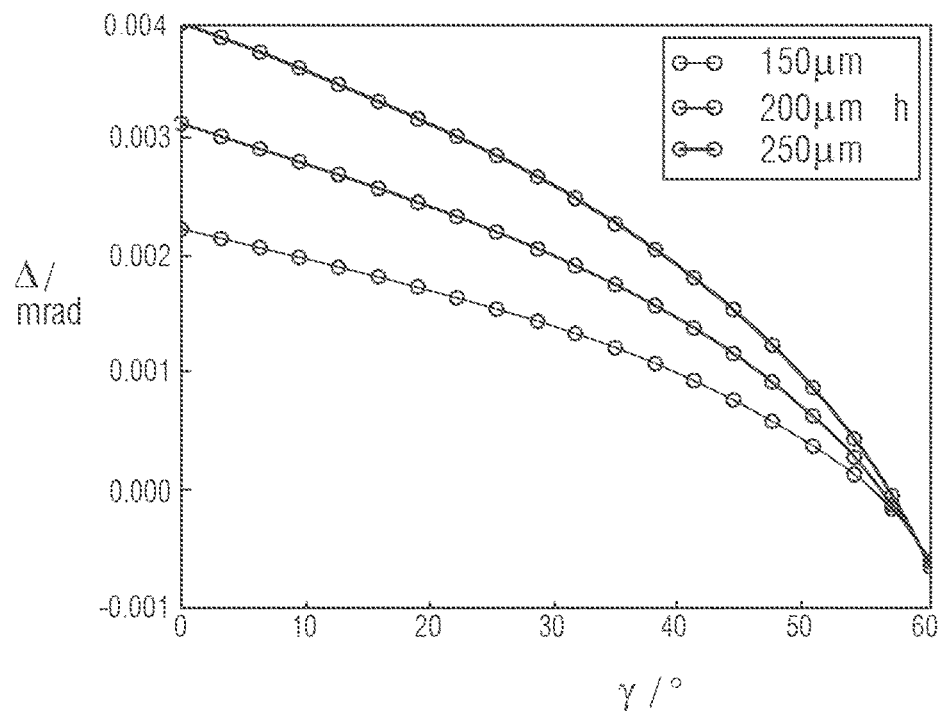
FIG 15A
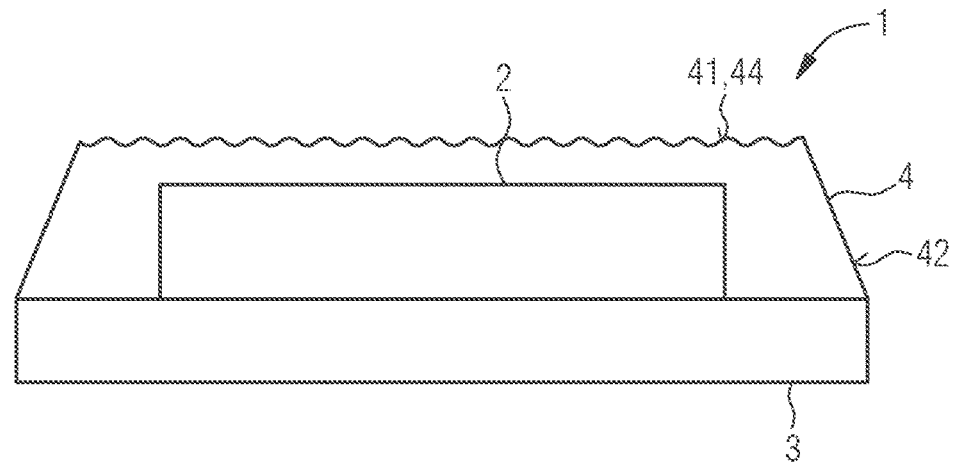
FIG 15B
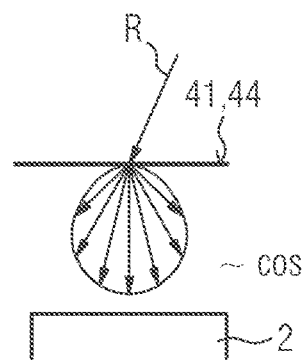
FIG 15C
```
det  mm   1.0
pck  mm   1.3
γ    °    0
h    μm   150
w    μm   300
```

SENSOR AND USE OF A SENSOR IN A 3-D POSITION DETECTION SYSTEM

This patent application is a national phase filing under section 371 of PCT/EP2018/075622, filed Sep. 21, 2018, which claims the priority of German patent application 10 2017 122 030.5, filed Sep. 22, 2017, each of which is incorporated herein by reference in its entirety.

TECHNICAL FIELD

A sensor and a 3-D position detection system are provided.

SUMMARY OF THE INVENTION

Embodiments provide a sensor with which a 3D position detection system can be operated precisely.

According to at least one form of embodiment, the sensor is configured for a 3D position detection system. This means that the sensor is intended to be a part of such a position detection system. Such a 3D position detection system serves in particular to detect the orientation and/or position in space of a moving component such as a display which is, in particular, worn by a user, and/or of control units, such as for computer games, and accordingly preferably to make a game environment from the field of virtual reality available. 3D stands for three dimensional.

In particular, the 3D position detection system is constructed as is described in U.S. Patent Application No. 2016/0131761 A1, whose disclosure is incorporated herein by reference in its entirety, in particular FIGS. 8, 28a and 28b, as well as paragraphs 81 to 89 and 102 and also claim 1.

According to at least one form of embodiment, the sensor comprises one or a plurality of sensor chips. The at least one sensor chip is configured for the detection of a radiation. The sensor chip can be a multi-channel sensor chip or a single-channel sensor chip, also referred to as a photodiode. The sensor chip is preferably a single-channel photodiode, in particular a PIN photodiode. The sensor chip can be based on silicon, but alternatively also on other material systems such as Ge, InGaAs or InGaP. The sensor chip can equally well be a sensor IC in which preferably a light-sensitive layer, integrated monolithically with integrated circuits, is present.

According to at least one form of embodiment, the sensor comprises at least one carrier, in particular precisely one carrier. The sensor chip is mounted on the carrier. The carrier can be a printed circuit board, abbreviated to PCB. The sensor chip is, in particular, contacted electrically via the carrier. The carrier is, for example, the component that mechanically supports and stabilizes the sensor.

According to at least one form of embodiment, the sensor comprises one or a plurality of cast bodies, in particular precisely one cast body. The cast body is translucent for the radiation to be detected, in particular transmissive and non-scattering. The sensor chip is preferably completely covered by the cast body.

According to at least one form of embodiment, a centroid shift of the sensor chip amounts to at most 0.04 mrad or 0.03 mrad or 0.02 mrad at angles of incidence up to at least 60°. In this context, centroid refers in particular to the position of a main focus of the detected radiation on a detection surface of the sensor chip. In the case of a perpendicular incident radiation, i.e., with an angle of incidence of 0°, the centroid of the radiation is preferably coincident with the geometric center of the detection surface of the sensor chip.

As a result of, for example, parallax effects or light refraction, the main focus of the radiation at angles of incidence not equal to 0° shifts away from the radiation centroid for an angle of incidence equal to 0°. This shift in the centroid, depending on the angle of incidence and preferably with reference to the centroid of the radiation with an angle of incidence of 0°, is referred to here and below as the centroid shift.

In at least one form of embodiment, the sensor is configured for a 3D position detection system, and comprises at least one sensor chip for the detection of a radiation as well as at least one carrier on which the sensor chip is mounted. A cast body that is transmissive for the radiation to be detected completely covers the sensor chip. A centroid shift of the sensor chip at angles of incidence up to at least 60° amounts to at most 0.04 mrad.

Use of such a sensor is also given. In particular, one or a plurality of sensors is or are employed, as described in connection with one or a plurality of the forms of embodiment mentioned above. Features of the use are thus also disclosed for the sensor, and vice versa.

According to at least one form of embodiment, a plurality of the sensors is employed in the 3D position detection system. The number of sensors is, for example, at least five or ten or 20 or 30. Alternatively or in addition, the number of sensors is at most 200 or 100.

According to at least one form of embodiment, the 3D position detection system comprises one or a plurality of radiation sources. Multiple radiation sources are preferably present. The at least one radiation source is configured for the generation of the radiation that is to be detected by the sensors.

According to at least one form of embodiment, the 3D position detection system comprises at least one user device. The user device is preferably a display device worn at the head of the user, also referred to as a Head Mounted Display or, abbreviated, HMD. The user device is designed in particular for the display of three-dimensional images for applications in the field of virtual reality. Precisely one such user device is preferably provided for each user, while additional user devices, perhaps in the form of what are known as controllers, can be present. In the case of a plurality of users, the user devices are preferably uniquely associated with the respective user. Nevertheless it is preferred at the same time that only precisely one user or only precisely two users are present.

According to at least one form of embodiment, the sensors are built into the user device or into the user devices. The numbers of sensor chips referred to above preferably apply to each user device. The sensors are preferably installed irreversibly.

According to at least one form of embodiment, the sensors are configured to determine angles between the user device and the radiation source. Through the determination of the angle, a spatial position and an alignment of the user device can be ascertained. This means that the interaction of the sensors with the at least one radiation source makes a precise localization of the user device possible, preferably in real-time.

In at least one form of embodiment, a plurality of the sensors is employed in one 3D position detection system. The 3D position detection system comprises at least one radiation source for the generation of the radiation that is to be detected by the sensors, as well as at least one user device. The sensors are installed in the user device. The sensors are furthermore configured to determine angles between the user device and the radiation source, so that by means of the angle a spatial position and an alignment of the user device can be ascertained.

Modern systems for applications in the field of virtual reality, also abbreviated to VR, usually require an optical recognition of a position and of an orientation of a VR headset and of controllers in order to enable a natural interaction, free from delays, with the virtual surroundings, for the user. In addition to a complete immersion in the virtual space, optical tracking allows for the prevention of motion sickness. Through the optical tracking, an updating of position data is enabled with higher precision and higher frequency, for example, of 1 kHz.

The VR system is, for example, SteamVR-Tracking from Valve, such as used by HTC Vive. Optical sensors at the object, in particular at the user device, are sampled here by laminar laser beams, and the angles relative to a base station are derived from time information.

Optical sensors used until now are not optimized for this application, and exhibit a systematic deviation of the measured position from the true position that depends on the angle of incidence of a laser beam. This deviation leads to an apparent distortion of the object, and must be calculated out using extensive algorithms in order to achieve the required precision of less than 1 mm. The use of conventional sensors thus limits a positional accuracy, and requires additional computing effort, moreover increasing the current requirement in particular of the user device, which is preferably operated wirelessly using batteries. An increased positional accuracy is possible with reduced computing effort using the sensors described here.

As a result it is possible to detect a larger angular range with the sensors described here, which reduces the number of sensors required and/or further increases the positional accuracy.

In the case of the sensor described here, its geometric properties are optimized both from the point of view of the sensor chip as well as from the point of view of the cast body. The centroid shift can thereby be sharply reduced or can be overcome. Different aspects of the sensor here bring about a constant, positive or negative offset of the centroid as a function of the angle of incidence. These offsets can either be optimized each for itself, depending on the particular cause, or can be optimized together. An almost complete suppression of the centroid shift is possible through the controlled balancing of positive and negative contributions.

Alternatively or in addition to a geometrical optimization, a diffusely transmitting surface, such as translucent glass, can be used, wherein, through such a surface, an angle information of the incoming radiation is suppressed, in particular completely suppressed. As a result, a complete or almost complete suppression of the angular offset, and thereby of the centroid shift, is possible.

Through the suppression of the angular offset, i.e., of the centroid shift, the measured position of the sensor agrees better with the actual position under all angles of incidence of the sampling laser beam. This means that no extensive algorithmic correction of the distortion that occurs is thus necessary, which leads to a sharp reduction in the required computing time. A battery lifetime rises as a result, and the possible rate of updating of the position data increases.

According to at least one form of embodiment, the radiation that is to be detected is near-infra-red radiation. A wavelength of maximum intensity of the radiation lies preferably at at least 780 nm or 810 nm and/or at a maximum of 1050 nm or 940 nm or 860 nm.

According to at least one form of embodiment, the radiation that is to be detected is at least partially a laser radiation. The laser radiation is preferably designed to be laminar in form. This means that the laser beam appears on a plane projection surface as a continuous, preferably straight line. Scanning occurs in particular, as described in document US 2016/0131761 A1, see for example, paragraph 73, whose disclosed content is included through reference.

According to at least one form of embodiment, the laser radiation is pulsed laser radiation. A repetition rate here preferably lies at at least 1 MHz; see document US 2016/0131761 A1, for example, paragraph 83. Pulse durations can be comparatively large, and amount, for example, to at least 50 ns or 100 ns and/or at most 0.5 is.

According to at least one form of embodiment, the radiation is moved in operation over a spatial region in which the user device is located when used as intended. A plurality of sequential pulses of the laser radiation is here preferably generated. Passing this way through the spatial region, also referred to as a sweep, takes place for example, in a vertical direction and in a horizontal direction, in particular in a linear form in each case, so that a scan line of the radiation source moves horizontally and/or vertically over the desired spatial region; see also document US 2016/0131761 A1, paragraphs 71 and 110, whose disclosed content is included through reference.

According to at least one form of embodiment, the scanning of the spatial region is designed in such a way that a plurality of sequential pulses of the laser radiation impinge on the relevant sensor chip. This means that to determine the angle, multiple laser pulses reach the relevant sensor chip; see also document US 2016/0131761 A1, for example, paragraphs 84 and 119, whose disclosed content is included through reference.

According to at least one form of embodiment, a temporal curve of the intensity of the incoming radiation, in particular pulse, is detected by the relevant sensor chip; see also document US 2016/0131761 A1, for example, paragraphs 84 and 119, whose disclosed content is included through reference. An evaluation of the temporal curve of the radiation can take place within the sensor, for example, in electronics of the carrier. Alternatively, this evaluation takes place outside the sensor, for example, in the user device or in a computer that is connected to the user device, preferably via a wireless data connection. The angle relative to the associated radiation source is ascertained from the temporal curve of the intensity.

According to at least one form of embodiment, the cast body protrudes beyond the associated sensor chip when viewed from above, all the way round, preferably with a consistent width. This means that, seen from above, the cast body forms a surrounding, preferably square or rectangular, frame around the sensor chip.

According to at least one form of embodiment, a ratio of a diagonal length of the cast body to an associated diagonal length of the sensor chip is at least 1.0 or 1.1 or 1.2. Alternatively or in addition, this ratio is at most 2 or 1.6 or 1.4. This means that, seen from above, the sizes of the cast body and of the associated sensor chip only differ from one another by a relatively small amount.

According to at least one form of embodiment, the cast body has a light inlet side that faces away from the associated sensor chip. The light inlet side is preferably oriented parallel to the detection surface of the sensor chip and/or to an upper chip side of the sensor chip. The light inlet surface is bounded on all sides by side walls of the cast body.

According to at least one form of embodiment, the light inlet side and/or side walls are smooth and planar. This means that the light inlet side and/or the side walls can be free from an optically active roughening.

According to at least one form of embodiment, an angle between the side surfaces and the light inlet side is at least 94° or 97° when viewed in cross-section. Alternatively or in addition, this angle lies at a maximum of 110° or 106° or 102°. This means that the side walls can be oriented at an angle to the light inlet side. It is alternatively possible that this angle lies at 90°, for example, with a tolerance of utmost 1° or 2°, so that the orientation of the side walls are then not inclined but perpendicular to the light inlet side.

According to at least one form of embodiment, the light inlet side and/or side walls are planar in form. This means that there is then no curvature, or no significant curvature, and in particular no optically effective curvature at these surfaces.

According to at least one form of embodiment, the light inlet side and/or side walls are transmissive for the radiation to be detected. It is alternatively possible that a coating that is not transmissive for the radiation is applied partially or completely, to the side walls in particular.

According to at least one form of embodiment, a free field of view at the light inlet side has an aperture angle of at least 120° or 140° or 160°. This means that, with reference to a normal to the light inlet side, and for an angular region relative to the light inlet side of at least 60° or 70° or 80°, there is no optical obstacle in the sensor, preferably in the user device. The radiation to be detected can thus impinge on the sensor at a relatively large angle to an optical axis thereof. The radiation can thus still be detected at large angles of incidence.

According to at least one form of embodiment, the sensor chips are, or at least one of the sensor chips is, contacted electrically with one or a plurality of bond wires at an upper chip side that faces away from the carrier. The bond wires here are preferably fully contained in the cast body.

According to at least one form of embodiment, the cast bodies extend beyond the bond wires in the direction away from the associated sensor chip by at most 150 μm or 120 μm or 100 μm. This means that only a comparatively thin protective layer is formed above the bond wires by the cast body.

According to at least one form of embodiment, a thickness of the cast body at the side that faces away from the associated sensor chip lies in each case at a maximum of 0.3 mm or 0.2 mm or 0.15 mm. In particular, the thickness of the cast body above the sensor chip is less than a thickness of the sensor chip itself.

According to at least one form of embodiment, the sensor chips comprise one or a plurality of electrical contact points at a side that faces away from the respective carrier. The electrical contact points are, for example, provided for making contact with the bond wires. In particular, the electrical contact points are metallizations that are not transmissive for the radiation to be detected.

According to at least one form of embodiment, a part of the contact points, or all the contact points, are arranged symmetrically around the associated side. This means that a minimum of some or all the contact points lie, in terms of a point reflection, opposite another contact point, wherein a mirror center is preferably the position of the centroid when radiation is impinging at an angle of incidence of 0°. The number of the contact points is preferably at least two or four or six and/or at most 16 or 12 or nine. The rule that contact points are arranged point-symmetrically with respect to one another preferably applies to at least 70% or 80% or 90% of the contact points. If, for example, there are five contact points, then with a proportion of 80% of symmetrically arranged contact points it follows that four of the contact points are attached point-symmetrically with respect to one another.

According to at least one form of embodiment, the carrier and the respective associated cast body are flush with one another. This means that, in particular in the direction parallel to the light inlet side, the cast body does not then extend beyond the carrier, and vice versa.

According to at least one form of embodiment, the chip side walls of the sensor chips are not transmissive for the radiation to be detected and/or make no contribution to a detector signal. This means that the chip side walls do not make any contribution to detection of the radiation.

According to at least one form of embodiment, the centroid shift of the sensor chip amounts to at most 0.015 mrad or at most 0.01 mrad at angles of incidence of up to at least 40°. This means that there is no significant centroid shift at comparatively small angles of incidence. In this case, a centroid shift only occurs at comparatively large angles of incidence.

According to at least one form of embodiment, the centroid shift can be approximated, depending on the angle of incidence, up to angles of incidence of at least 60° or 70° by a quadratic function, wherein a difference between the approximation and the real centroid shift amounts to at most 0.003 mrad or at most 0.002 mrad. This makes it easily possible to correct the centroid shift computationally, with little additional computing effort.

According to at least one form of embodiment, the centroid shift at small angles of incidence has a different arithmetic sign than at large angles of incidence. A boundary between small and large angles of incidence here preferably lies at a minimum of 7° or 10° and/or at a maximum of 25° or 20° or 15°. This means that the centroid shift changes its arithmetic sign approximately in the region around 10°. In this way it can be arranged that at comparatively small angles of incidence, no centroid shift, or no significant centroid shift, occurs.

The features mentioned above in respect of the centroid shift can be understood as design criteria for the geometry of the sensor.

According to at least one form of embodiment, the sides of the cast body that face away from the sensor chip can be partially or completely roughened. The result of the roughening is preferably a Lambertian or approximately Lambertian scatter and emission of the radiation to be detected through to the associated sensor chip. Lambertian radiation means that a cosine characteristic is present, in particular having a tolerance of at most 10% or 5% of a maximum intensity.

According to at least one form of embodiment, the carriers are designed such that a proportion of the surface of at least 80% or 90% or 95% or completely is diffusely reflecting in the regions next to the sensor chip. These surfaces can thus appear white to an observer, or can also exhibit a comparatively low, diffuse degree of reflection, so that these areas can appear in the latter case to be dark grey or black to an observer.

According to at least one form of embodiment, the user device is a pair of glasses for the region of the virtual reality with one or a plurality of displays for the display of three-dimensional images. The user device thus can be an HMD.

BRIEF DESCRIPTION OF THE DRAWINGS

A sensor and a 3-D position detection system are described in more detail below with reference to the drawing and on the basis of exemplary embodiments. The same reference signs here indicate the same elements in the individual figures. No true-to-scale references are, however, illustrated, but the individual elements may rather be illustrated with exaggerated size for the sake of better understanding.

FIGS. 1, 2A-2C, and 15A-15D show schematic illustrations of exemplary embodiments of sensors;

FIGS. 10, 11, and 12A-12E show schematic illustrations for the optimization of sensors; and FIGS. 13A-13C and 14A-14E show schematic illustrations of optical properties of sensors.

DETAILED DESCRIPTION OF ILLUSTRATIVE EMBODIMENTS

Figure 1:
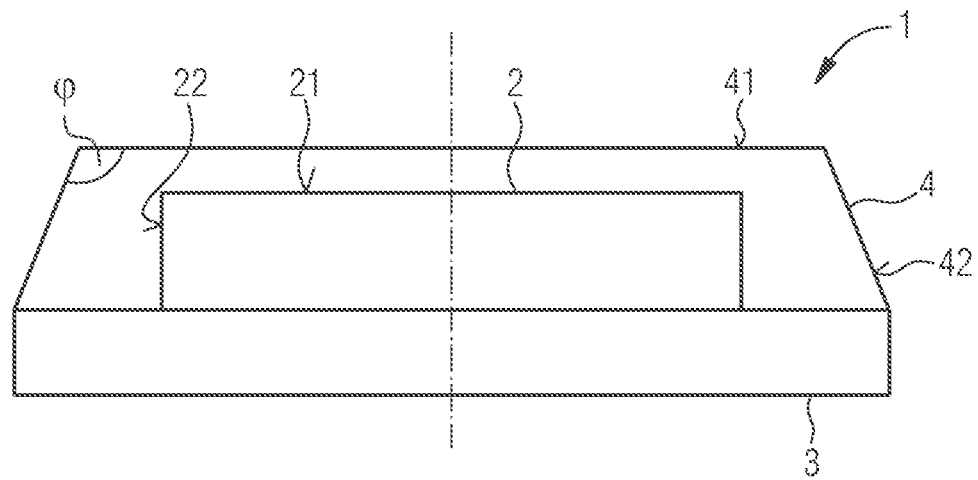

A sectional view of an exemplary embodiment of a sensor 1 is shown in FIG. 1. The sensor 1 comprises a carrier 3, such as a printed circuit board. A sensor chip 2 with an upper chip side 21 that faces away from the carrier 3, which is a detection face, is located on the carrier 3. Preferably, no signal is detected via chip side walls 22. The sensor chip 2 is preferably a PIN silicon photodiode.

The sensor 1 further comprises a cast body 4. According to FIG. 1, a light inlet side 41 that faces away from the carrier 3 is smooth, flat and planar. An angle φ between the light inlet side and the side walls 42 of the cast body 4, wherein the walls are also designed to be smooth, flat and not transmissive to the radiation, lies, for example, at 100°.

The sensor 1 can comprise additional components, not illustrated, such as spectral filters, so that only the radiation that is to be detected reaches the sensor chip 2, and other wavelengths are absorbed or reflected. The cast body 4 is, for example, absorbent for visible light.

Figure 2A:
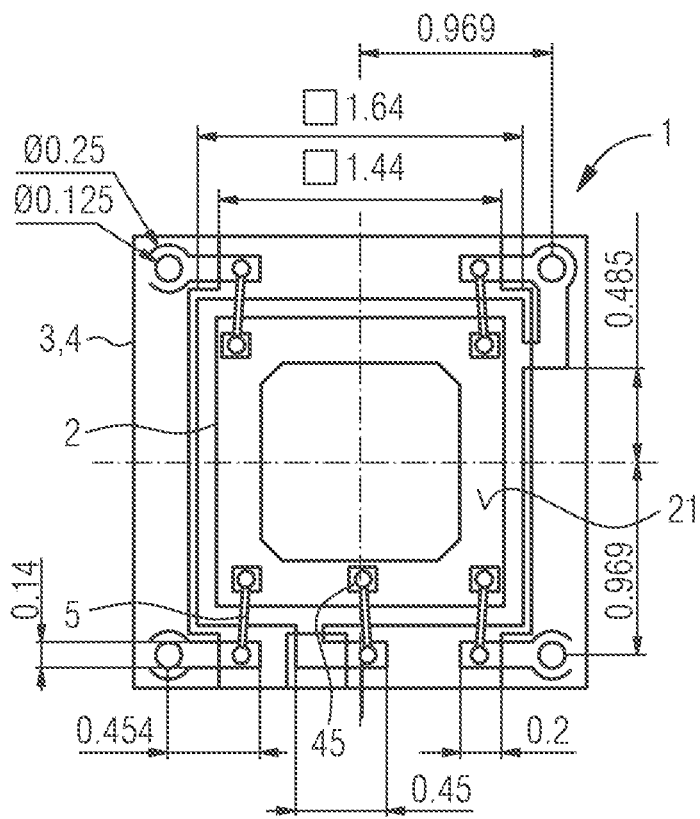
Figure 2B:
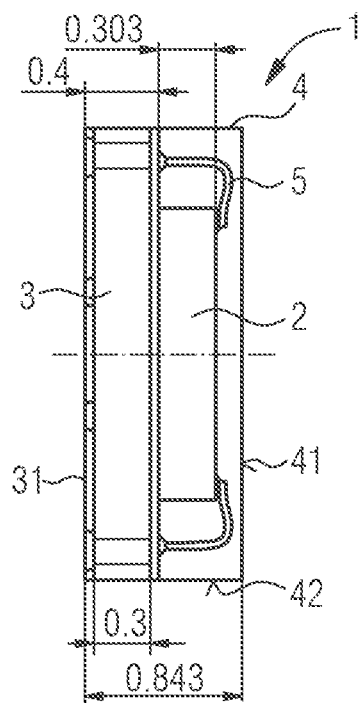
Figure 2C:
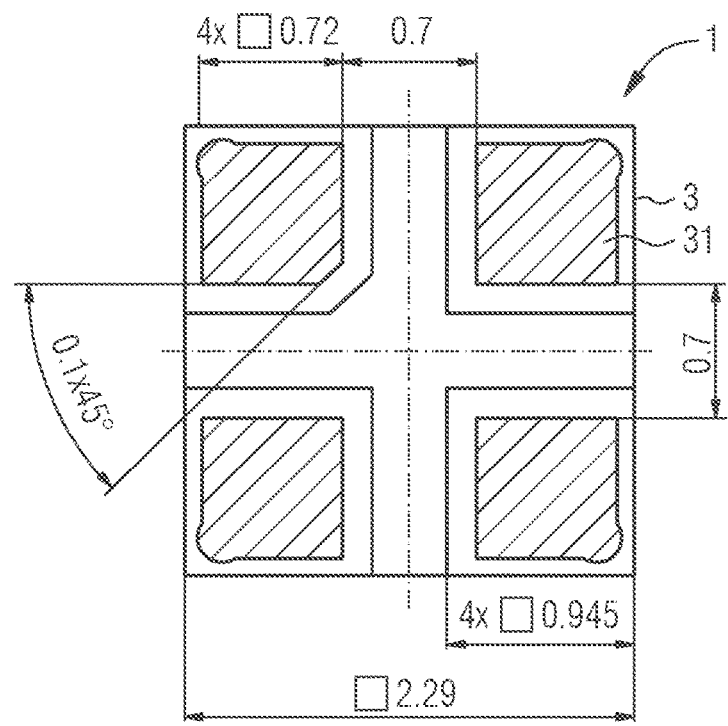

FIG. 2A illustrates a plan view, FIG. 2B a side view and FIG. 2C a view from underneath of a further exemplary embodiment of the sensor 1. The dimensions given in FIG. 2 preferably apply individually or jointly, each having a tolerance of at most 50% or 25% or 5%.

On a lower side that faces away from the sensor chip 2 and also on the upper side that faces the sensor chip 2, the carrier 3 comprises a plurality of electrical carrier contact surfaces 31, via which the carrier 3 can be electrically and mechanically attached. The electrical contact points 45 at the upper chip side 21 are formed through metallizations, and each is connected via bond wires 5 to associated carrier contact surfaces 31. Of the total of five electrical contact points 45, four are arranged point-symmetrically to one another with reference to a geometrical center point of the upper chip side 21.

Differing from FIG. 1, the side walls 42 of the cast body 4 are configured perpendicular to the light inlet side 41. In other respects the explanations to FIG. 1 preferably also apply to FIG. 2, and vice versa.

Figure 3A:
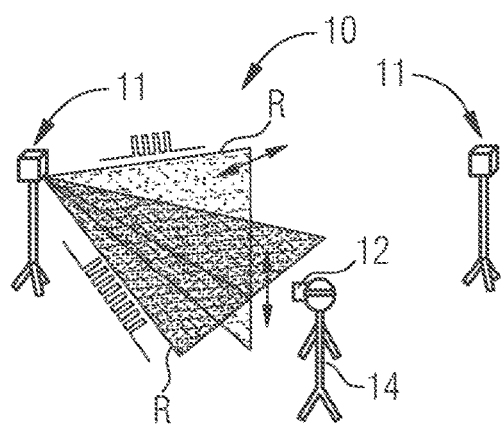
FIGS. 3A, 3B, 4A, and 4B show schematic illustrations of 3D position detection systems with sensors.

A 3D position detection system 10 is illustrated in a perspective view in FIG. 3A; see also the document US 2016/0131761 A1. The system 10 comprises a plurality of radiation sources 11 which emit a laminar laser radiation R horizontally and vertically in the near-infra-red spectral region, and which scan in vertical and horizontal lines, also referred to as a SWEEP. A user 14 wears a user device 12 that comprises a plurality of the sensors. This system 10 enables a high temporal resolution, so that a time difference between a movement of the user 14 and a new acquisition of the position of the user 14 is relatively small, in order to minimize or prevent the occurrence of motion sickness.

Figure 3B:
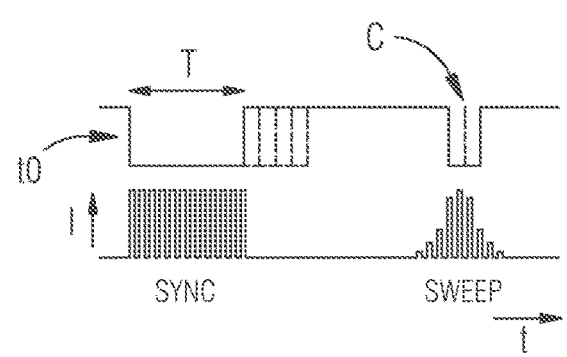

Each radiation source 11, also referred to as a lighthouse, here emits an infra-red flash with a duration T in order to specify a starting time point to. The infra-red flash follows the vertical and horizontal laser scanning. The infra-red flash is also referred to as a SYNC. A time difference between this SYNC and a detection time of the SWEEP allows for the calculation of the angle of the sensor concerned relative to the radiation source 11; see FIG. 3B.

Figure 4A:
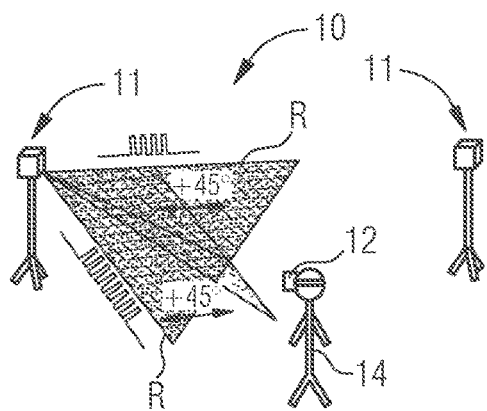

In the exemplary embodiment of the system 10 as is shown in FIG. 4A each radiation source 11 emits a laser sweep with a repetition rate of 50 Hz or 60 Hz.

Figure 4B:
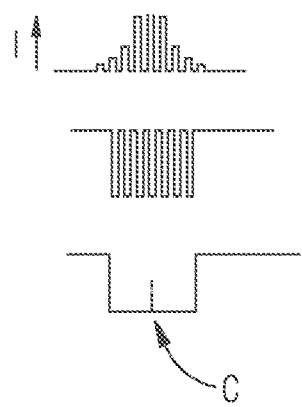

In particular, the angular position is found from a position of a centroid C of a signal intensity I; see FIG. 4B.

Figure 5:
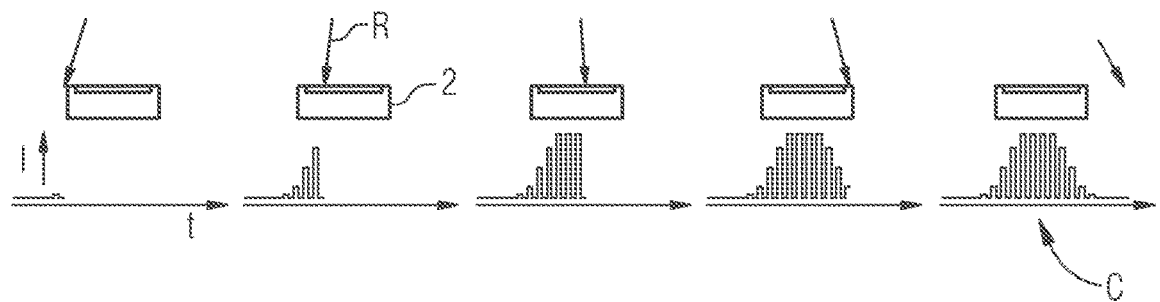
FIG. 5 shows a schematic illustration of a scanning of a sensor.

The emergence of the signal is illustrated in connection with FIG. 5. During the laser sweep, the laser intensity, leaving aside the modulation, is constant, and the radiation R is moved over the sensitive surface of the sensor chip 2. A detector signal here is a convolution of the sensor geometry and the beam profile of the laser radiation. The centroid C of the detected signal corresponds in the ideal case to a center of the detector. An incorrect determination of the position of the centroid C thus yields incorrect time information and an incorrect angular position relative to the radiation source 11. Since a positional accuracy in the sub-millimeter range is required, even small centroid shifts can lead to an impairment in the 3D positional accuracy.

Figure 6:
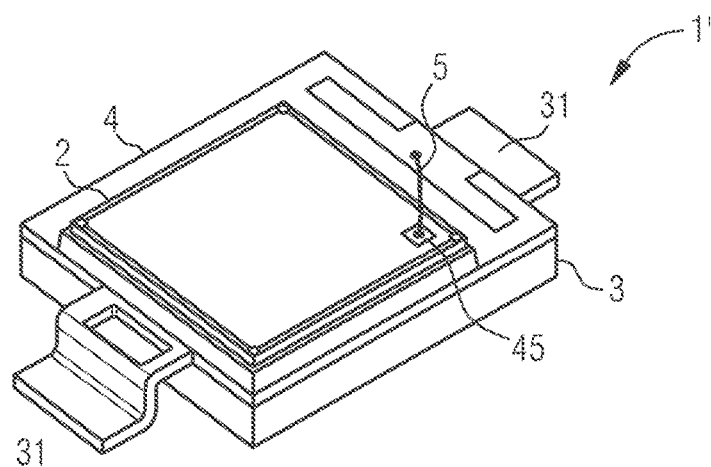
FIGS. 6, 7A-7C, 8A-8F, 9A, and 9B show schematic illustrations of the optical properties of conventional sensors.

A perspective view of a conventional sensor 1' is illustrated in FIG. 6. The sensor 1' is, for example, the BPW34S sensor manufactured by Osram.

Figure 7A:
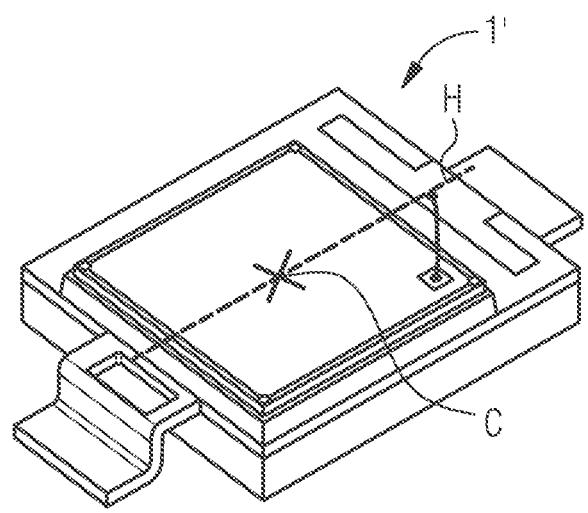
Figure 7B:
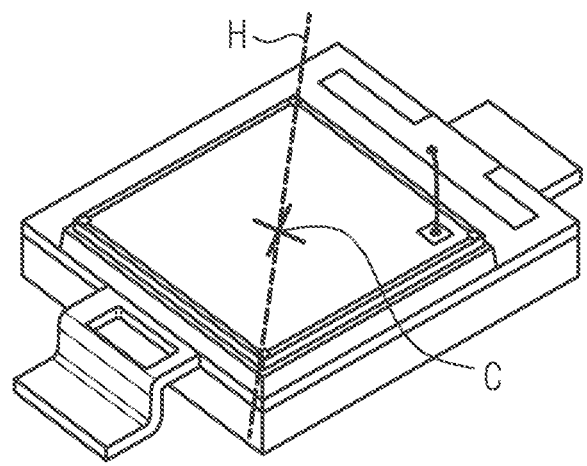
Figure 7C:
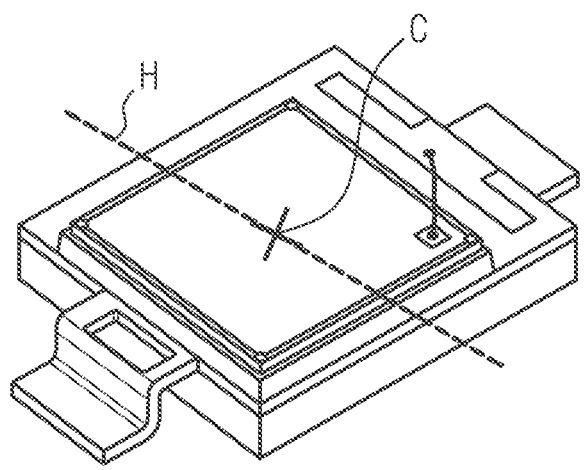

Various center lines H relative to the sensor 1' of FIG. 6 are shown in FIG. 7. While the laser beam R is scanned over the detector surface, the left-hand and right-hand halves of the detector surface, separated by the line H, must, in the ideal case, receive the same optical power. The line H can have any orientation to the sensor 1', illustrated in FIGS. 7A, 7B and 7C.

Various cases, through which a shift between the centroid C as the geometrical center point and the detected centroid C* can arise at larger angles of incidence, are illustrated in FIG. 8.

Figure 8A:
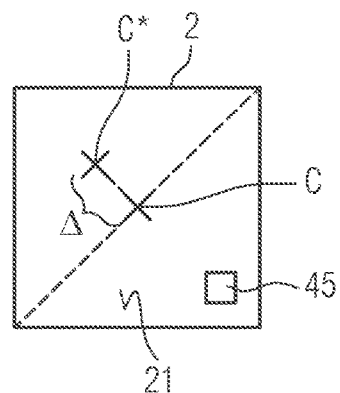

An asymmetrically applied electrical contact point 45 is present according to FIG. 8A. As a result, the radiation sensitive area is reduced on one side, and the centroid C* shifts in the direction away from this contact point 45, so that a centroid shift Δ results.

Figure 8B:
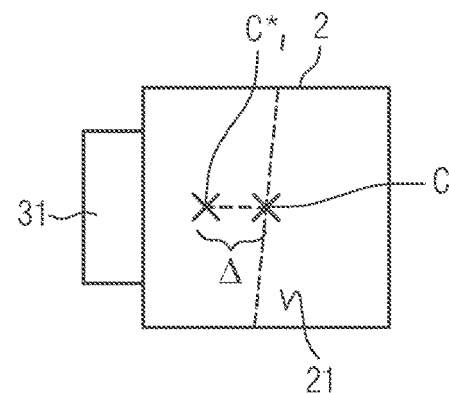

In FIG. 8B it is shown that a reflective element, in particular a carrier contact surface 31, is present. The laser radiation R is reflected at this reflective element, and this region appears brighter, in part due to multiple reflections. The centroid C* thus shifts toward this carrier contact surface 31.

Figure 8C:
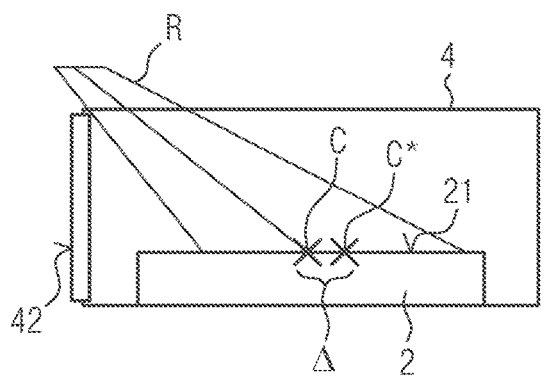

According to FIG. 8C, partial shading results from the side walls 42. The centroid shift Δ of the detected centroid C* with respect to the ideal centroid C thus occurs in a direction away from this side wall 42.

Figure 8D:
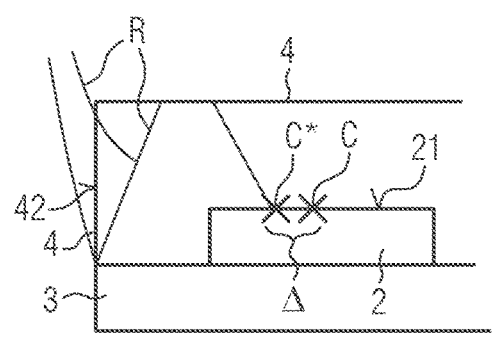

FIG. 8D illustrates that a part of the radiation R enters through the side wall 42, is reflected at the carrier 3, and contributes to the signal by way of multiple reflections or diffuse scatter. The centroid C* thus shifts in a direction toward the relevant side wall 42.

Figure 8E:
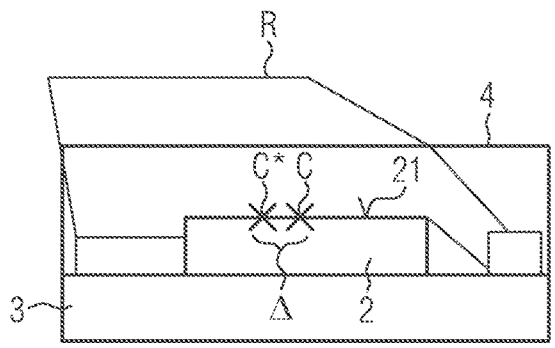

FIG. 8E illustrates the case in which the radiation R arrives obliquely. The carrier 3 is thereby partially shaded, and reflections of different strengths occur at different locations of the carrier 3. The centroid C* thus moves in the direction toward the unshaded region.

Figure 8F:
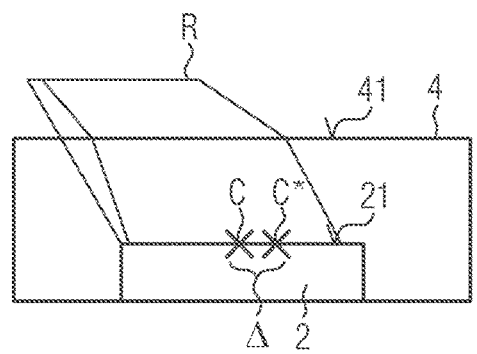

FIG. 8F finally shows that a centroid shift $\Delta$ occurs as a result of refraction of the radiation R at the light inlet side 41. The centroid C* thus moves in the radiation direction away from the geometric centroid C.

Figure 9A:
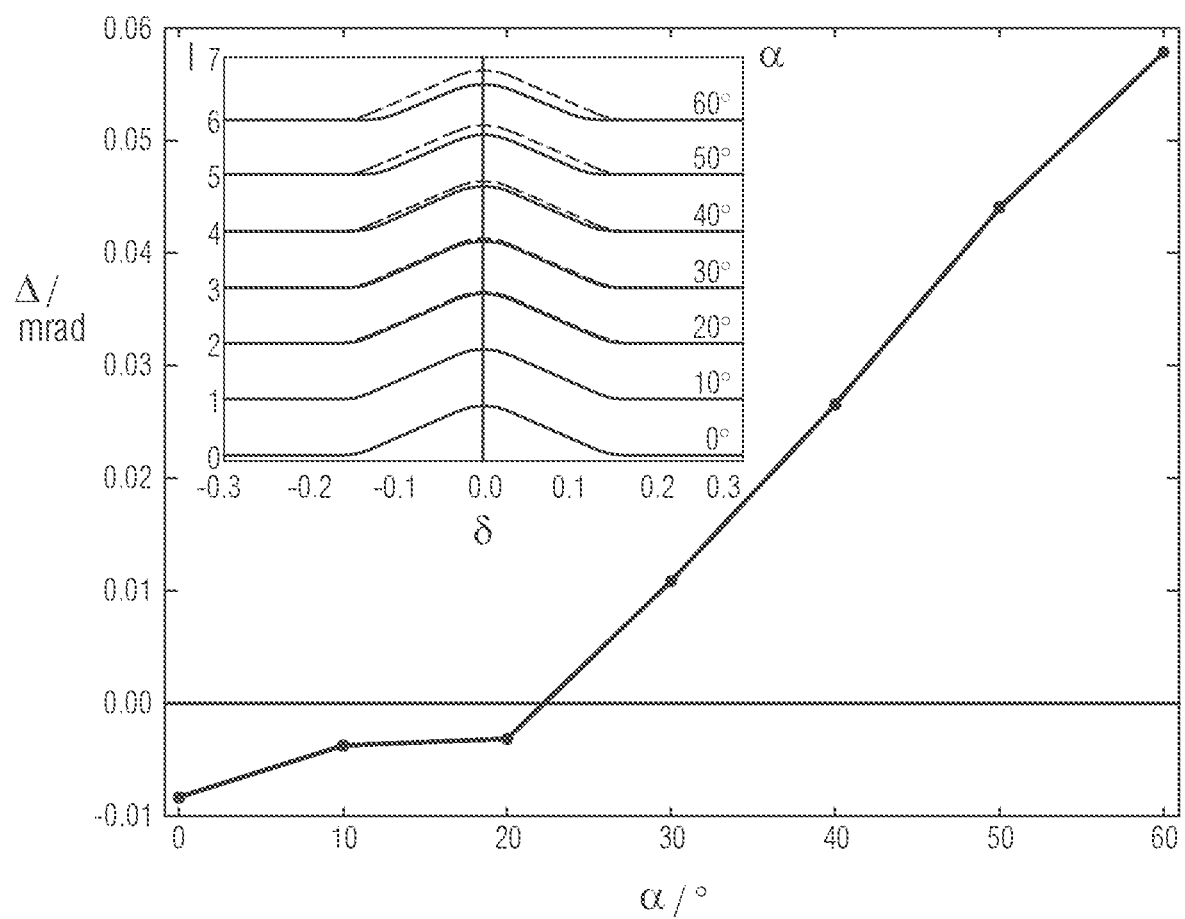
Figure 9B:
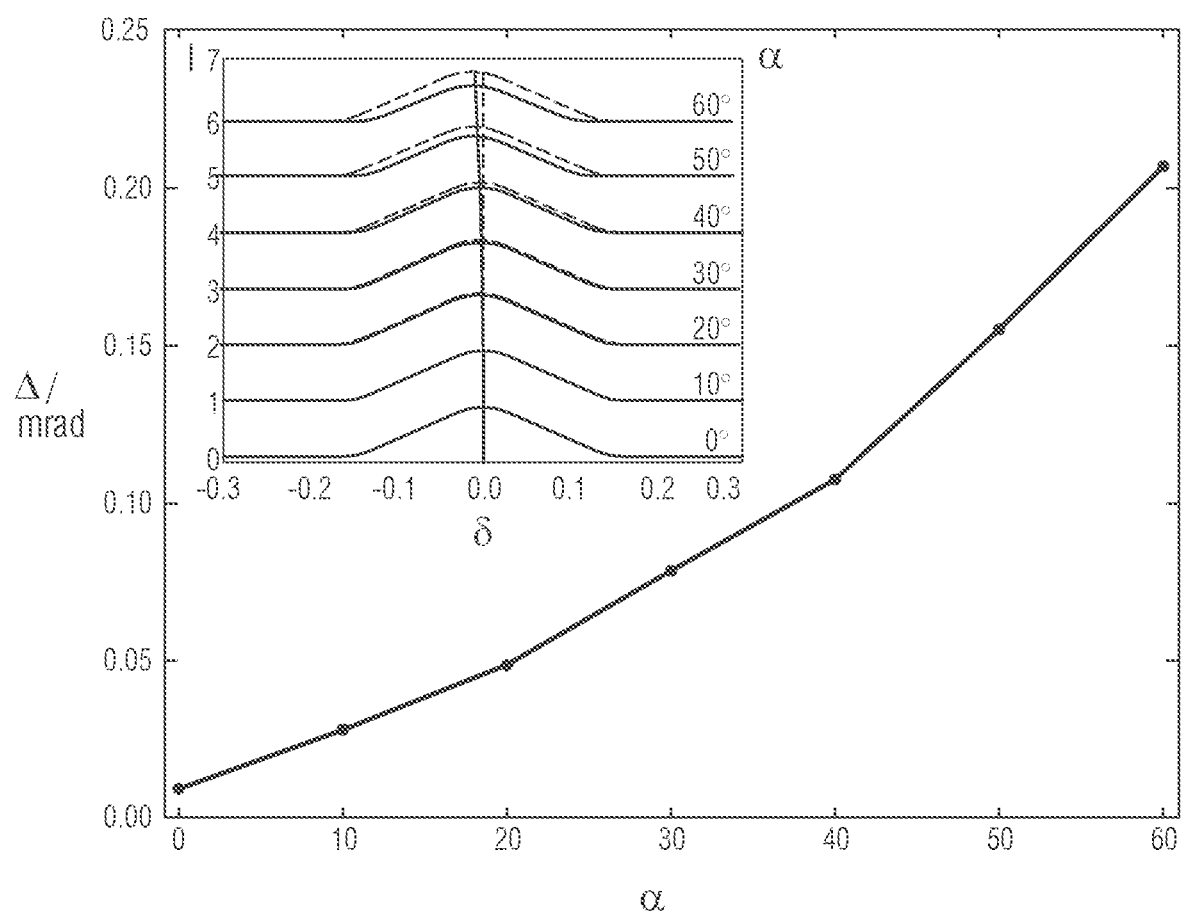

The centroid shift $\Delta$ depends here on the angle of incidence $\alpha$. This is illustrated in connection with FIG. 9. FIG. 9A here refers to the sensor 1' illustrated in FIGS. 6 and 7. FIG. 9B relates to the SFH 2200 sensor manufactured by Osram.

It can be seen from FIGS. 9A and 9B that, in particular toward larger angles of incidence $\alpha$, there is a significant increase in the centroid shift $\Delta$, which lies in the region significantly above 0.05 mrad. Here, S indicates a scan angle around the respective angle of incidence $\alpha$.

A centroid shift $\Delta$ of, for example, 0.1 mrad corresponds to a shift in the apparent position of the sensor 1 of 0.5 mm if there is a distance of 5 m to the respective radiation source 11.

The effects illustrated in FIG. 8 can be partially or completely compensated for through various design measures. For example, the effects illustrated in FIGS. 8A and 8B depend entirely on the geometry, and have no significant angular dependency and an approximately constant amplitude.

In the effects of FIGS. 8C and 8F, the direction of the centroid shift $\Delta$ and its magnitude depend on the angle of incidence $\alpha$, and run in the opposite direction to the angle of incidence $\alpha$, meaning that if the radiation R comes, for example, from the left, the centroid C* shifts to the right.

In contrast, the shifts A of FIGS. 8D and 8E shift in the same direction as the angle of incidence $\alpha$, so that if radiation R comes from the left, a centroid shift $\Delta$ also occurs to the left, while the magnitude of the centroid shift $\Delta$ also depends on the angle of incidence $\alpha$.

The effects of FIGS. 8C and 8F can thus partially or fully compensate for the effects of FIGS. 8D and 8E. The considerations in this respect are explained in more detail, in particular in connection with the following FIGS. 10 to 12.

Figure 10:
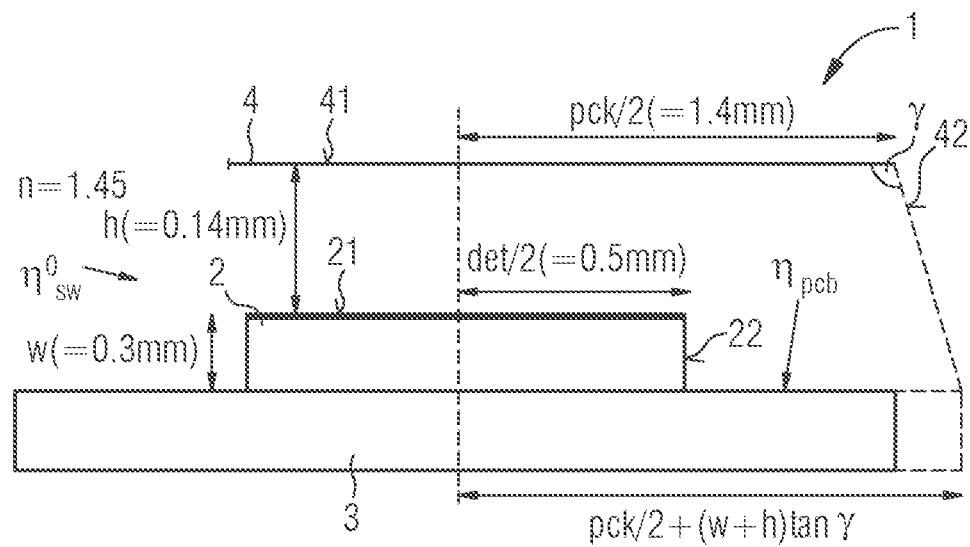

A sectional view is shown in this connection in FIG. 10, wherein the plurality of parameters are illustrated. n represents the refractive index of the cast body 4 at the wavelength of the radiation R that is to be detected. h indicates the thickness of the cast body 4 between the light inlet side 41 and the upper chip side 21. The parameter w indicates the thickness of the sensor chip 2, det identifies the edge length of the sensor chip 2, and pck refers to the edge length of the light inlet side 41. $\gamma$ represents an angle of the side walls 42 to a perpendicular to the light inlet side 41. The magnitude $\eta_{pcb}$ is an empirical factor, and relates to the influence of the reflectivity of the carrier 3. $\eta°_{sw}$ is, correspondingly, an empirical parameter for the influence of the reflectivity of the side walls 42.

Figure 11:
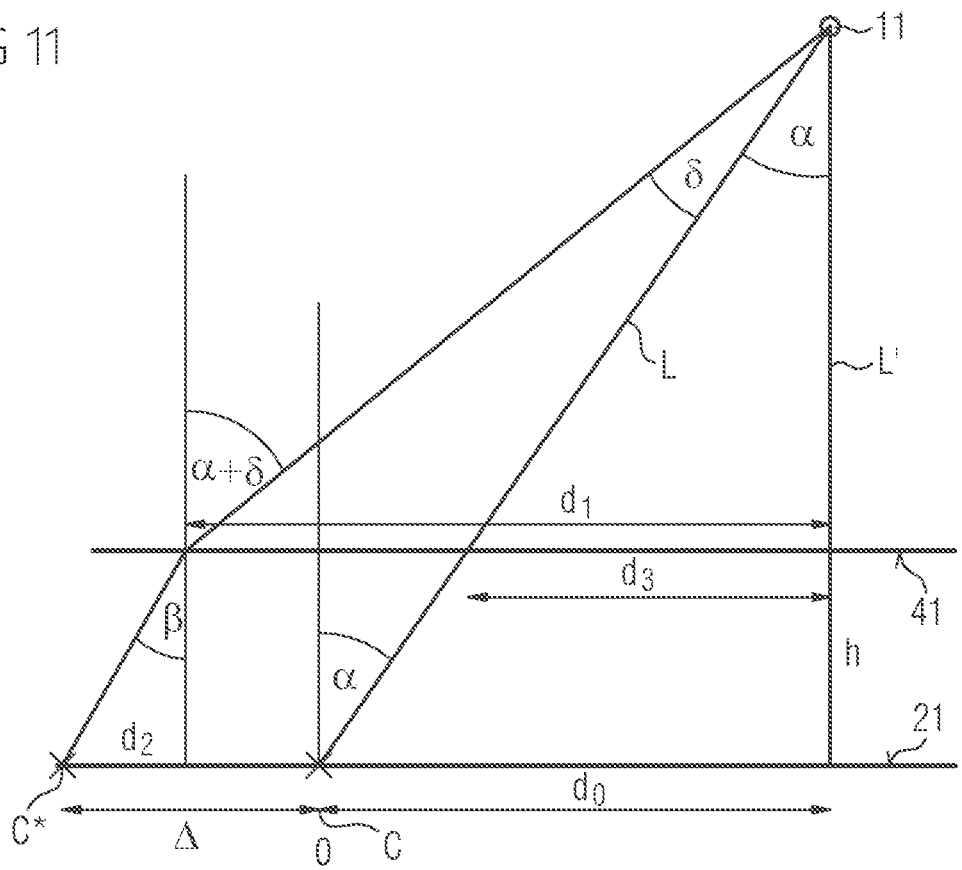

The geometrical aspects are illustrated in more detail in FIG. 11 on the basis of the sectional illustration of FIG. 10. The angle $\alpha$ stands for the angle of incidence that is the angle to the light source 11. The angle $\delta$ is the scanning angle about the angle $\alpha$. The angle $\beta$ results from light refraction at the light inlet side 41. The centroid shift $\Delta$ between the ideal centroid position C and the apparent centroid position C* results from this effect in particular.

Various distances d, L are furthermore drawn. The distance L between the sensor 1 and the radiation source 11 is, for example, 1 m. Relationships accordingly resulting from this are illustrated in the formulas in FIG. 12A, and are illustrated again in more detail in connection with FIG. 12B. The signal S resulting from this at the detector, depending on the scan angle $\delta$, can be seen for various cases in FIG. 12C. A contribution from Fresnel transmissions results from FIG. 12D, while contributions of the side walls can be found in FIG. 12E.

Depending on the desired application case, the geometry can be varied accordingly with reference to the illustrations of FIGS. 10 to 12, in order to achieve the desired result. Exemplary results derived from this are shown in FIGS. 13 and 14.

The data in particular show that the cast body 4 is particularly preferably clear and transparent for the radiation to be detected, and comprises a smooth, transmissive light inlet side 41 as well as smooth side walls 42 that are transmissive for the radiation. As is also the case in all the other exemplary embodiments, additional components can be present which do not impair or do not significantly impair the radiation R that is to be detected, for example, daylight filters which to a large extent only allow the radiation R that is to be detected to pass through.

The sensor chip 2, the electrical contact points 45, and the carrier contact surfaces 31 on the side of the carrier 3 that faces toward the sensor chip 2 are, moreover, to be arranged as point-symmetrically as possible. This eliminates or reduces in particular the effects that are illustrated in FIGS. 8A and 8B. For example, at least 80% or 90% or 95% of the relevant surfaces of the sensor chip 2, of the carrier 3, of the light inlet side 41, of the carrier contact surfaces 31 and/or of the electrical contact points 45 are arranged point-symmetrically.

The height of the cast body 4 and the width of the cast body 4 are set such that the sensitive surface of the sensor chip 2 has an angle of view of at least 60°, preferably of at least 70° or 80° with respect to an optical axis of the sensor chip 2. Shadowing effects are thereby reduced. In addition, an optical thickness of the cast body 4, in particular above the upper chip side 21, is to be minimized, and the light inlet side 41 is to be designed to be as flat as possible. This reduces or overcomes the effects of FIGS. 8C and 8F. The effects of FIGS. 8C and 8F here usually make the biggest contributions.

The contributions that are caused by the effects of FIGS. 8C and 8F and that cannot be eliminated can be partially or fully compensated for by the opposing effects of FIGS. 8D and 8E, in particular through adjusting the diffuse or specular reflectivity of the side walls 42 and of the upper side of the carrier 31 that faces toward the sensor chip 2, for example, through a deliberate enlargement of a surface of the carrier contact faces 31 or through the angle $\gamma$ of the side walls 42.

Figure 13A:
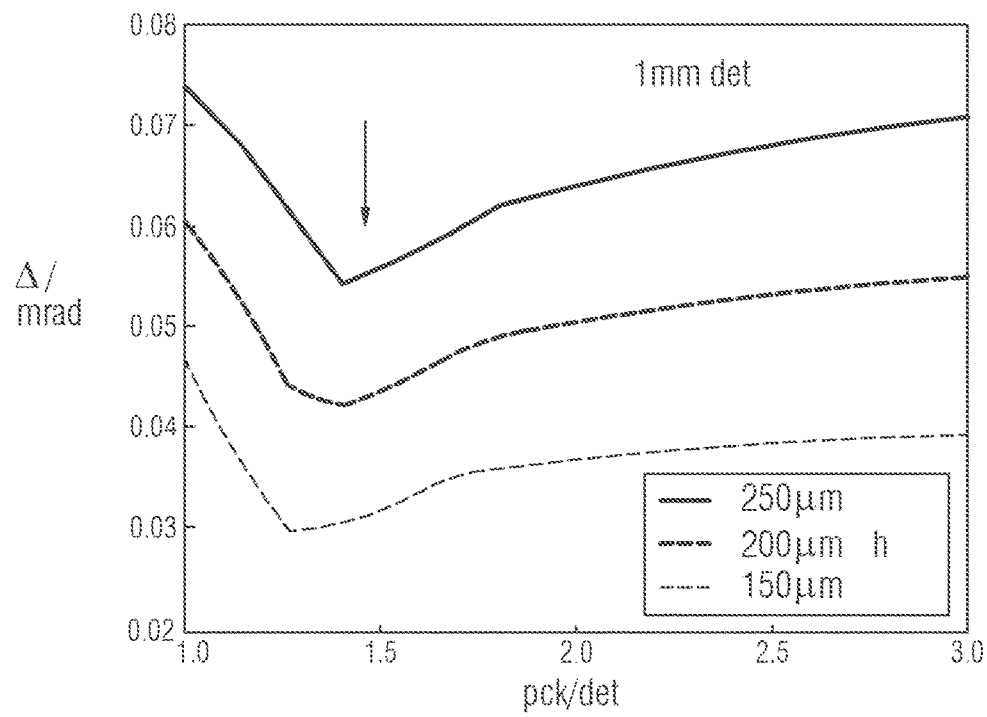
Figure 13B:
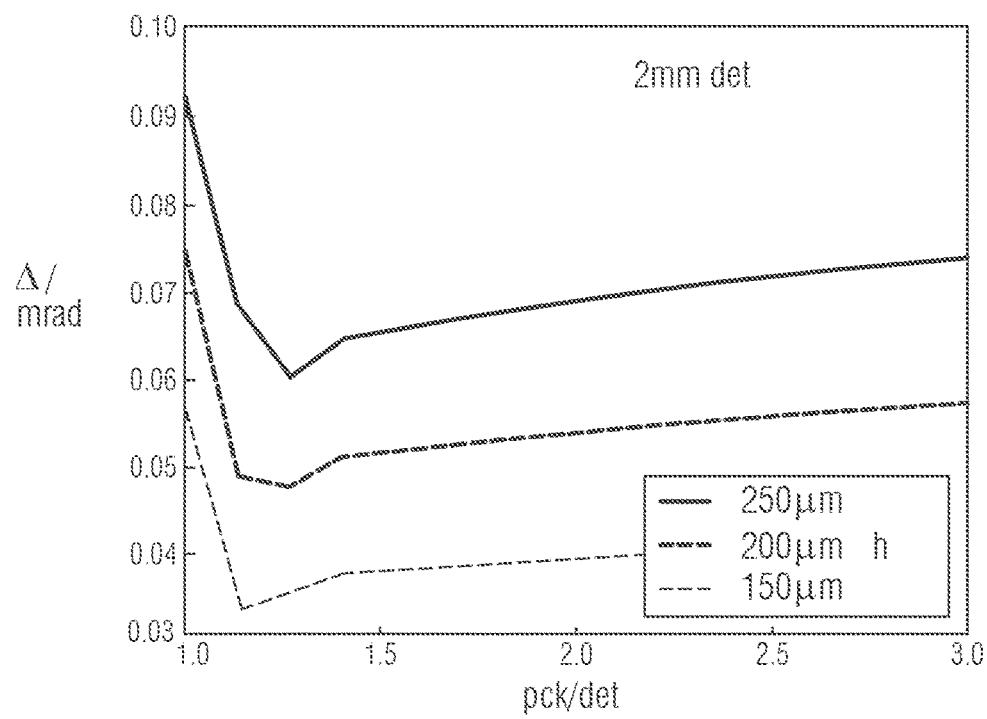
Figure 13C:
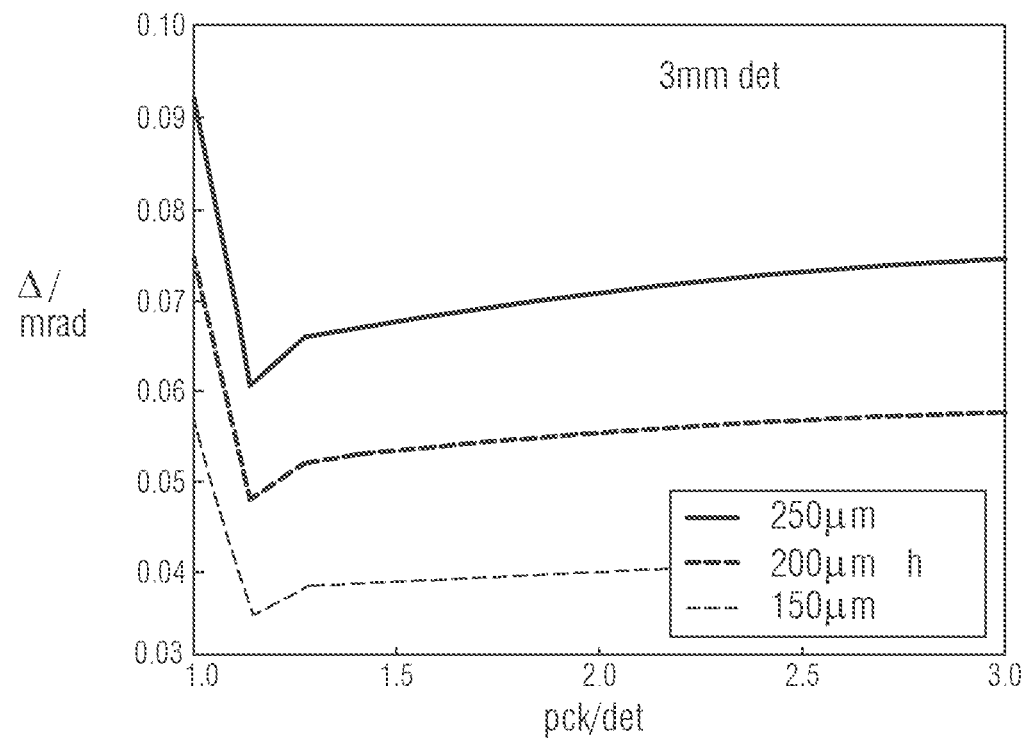

A quotient of the edge length pck of the cast body 4 and of the edge length det of the sensor chip 2 is plotted for this purpose in FIG. 13 against the centroid shift $\Delta$ for various thicknesses h of the cast body 4 over the upper chip side 21. In FIG. 13A, det is here 1 mm, in FIG. 13B it is 2 mm and in FIG. 13C it is 3 mm.

It can be seen that the centroid shift Δ has a minimum value for a pck/det quotient of 1.3. The pck/det quotient is accordingly to be set to about 1.3.

Figure 14A:

The geometrical parameters are illustrated in FIG. 14A for a further exemplary embodiment of the sensor 1. In contrast to the BPW34S manufactured by Osram of FIG. 6, with the sensor 1 described here a significant reduction in the centroid shift Δ results; see the left-hand side of FIG. 14B. The corresponding signal intensities I depending on the respective scan angle δ are illustrated here for various angles of incidence α in the right-hand side of FIG. 14B. The solid line here is related to the BPW34S sensor, and the dotted line to the sensor 1 described here. As a result of the geometric optimization, there is no significant effect on the signal intensity I.

Figure 14B:
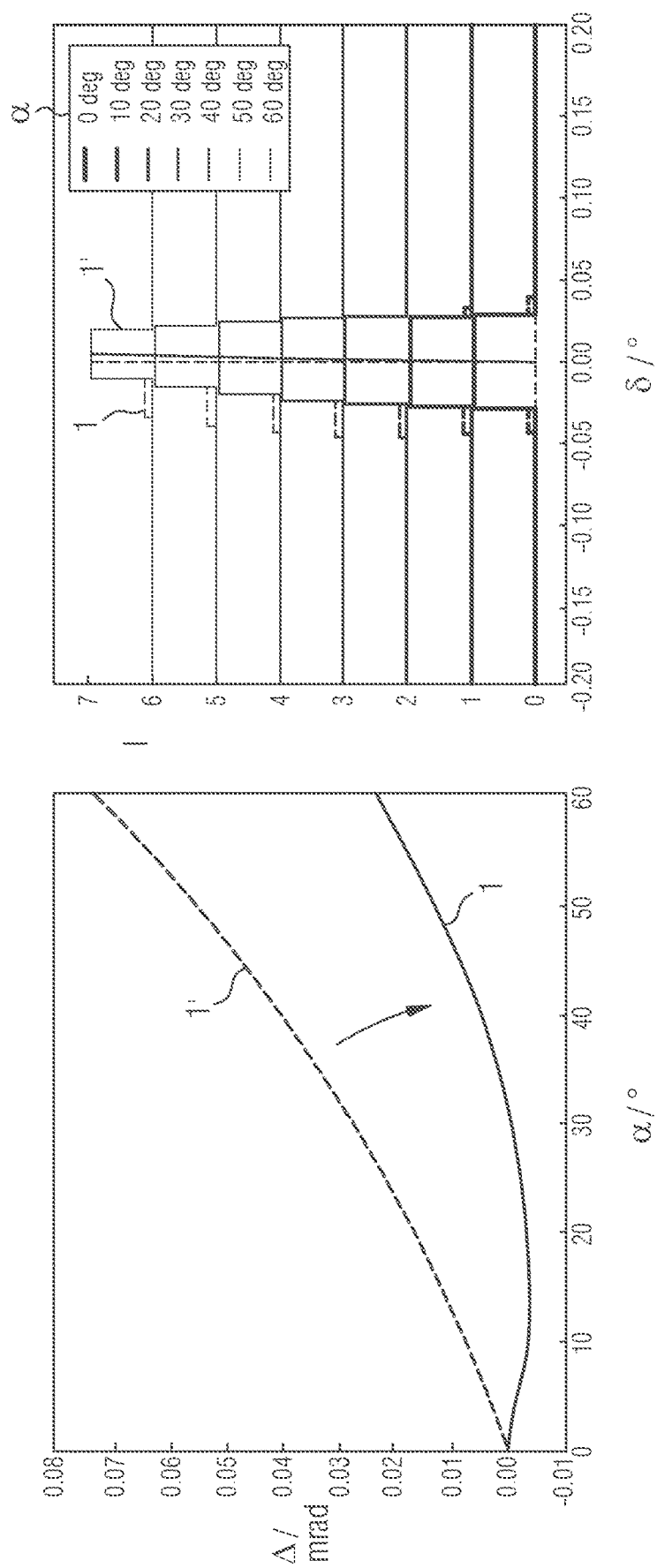
Figure 14C:
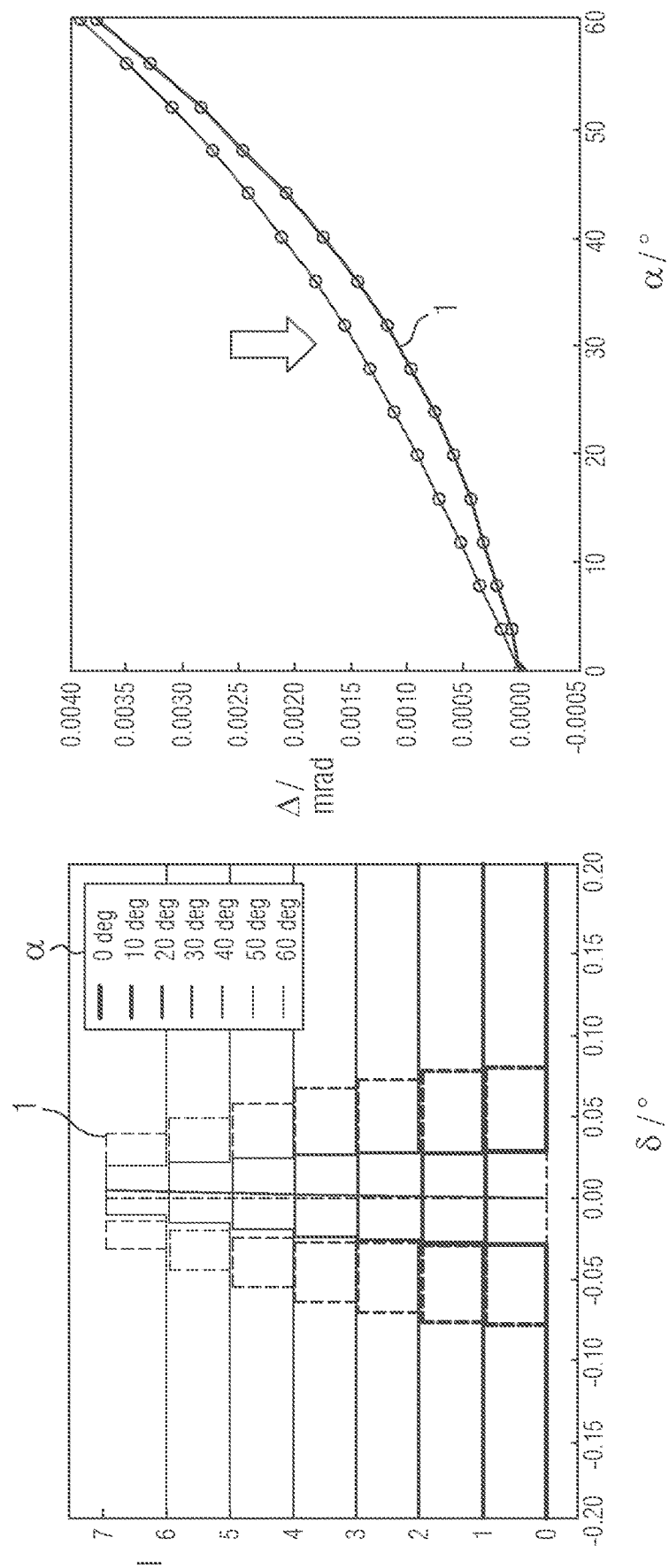

In a manner similar to that of FIG. 14B, the influence of a diffuse reflectivity of the carrier 3 at the side that faces the sensor chip is plotted in FIG. 14C. The empirical parameter $\eta_{pcb}$ here has a value of 1.0, corresponding to a diffusely reflecting surface. The centroid shift Δ can be reduced through the diffuse reflectivity.

Figure 14D:
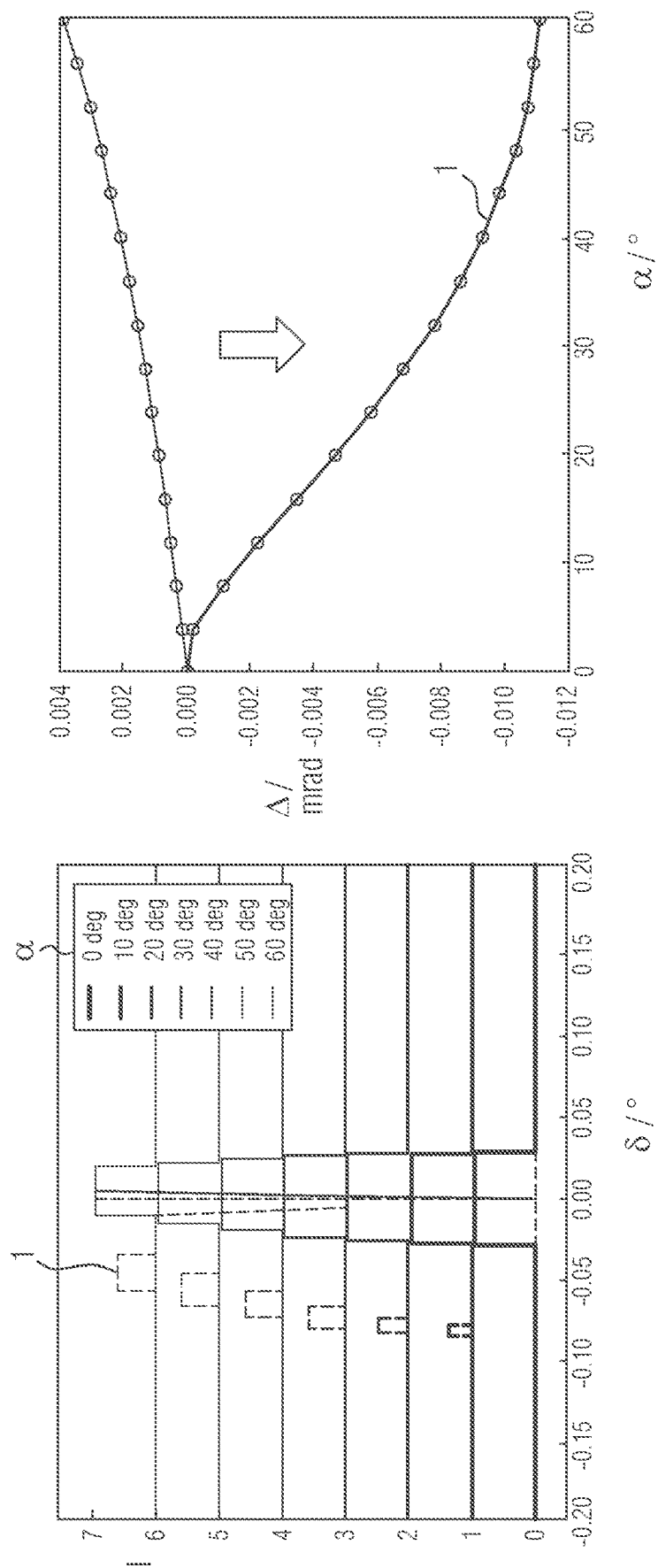

The case of diffusely reflecting side walls 42 is illustrated in FIG. 14D for a $\eta°_{sw}$ of 10.0 and for an absorptive upper side of the carrier 3, i.e., $\eta_{pcb}=0$. A negative centroid shift Δ can be achieved through such side walls 42, with which other effects can be compensated for.

The effect of the tilt angle γ of the side walls 42 is shown in FIG. 14E. An angle of incidence Δ of 60° is assumed here, and a parameter $\eta°_{sw}$ of 0.5, and a contribution of the carrier of $\eta_{pcb}$ of 0.1. The pck/det quotient lies in the present case at 2.8. The centroid shift Δ can be further adjusted through the angle γ.

A further exemplary embodiment of the sensor 1 is shown in a sectional view in FIG. 15A. The light inlet side 41 is here roughened 44 over the whole area. The explanations relating to the other exemplary embodiments otherwise apply here correspondingly. The associated geometric parameters can be found in FIG. 15C.

A Lambertian scatter of the radiation R at an inner side of the light inlet side 41 through to the sensor chip 2 is achieved through the roughening 44; see FIG. 15B.

Figure 15D:
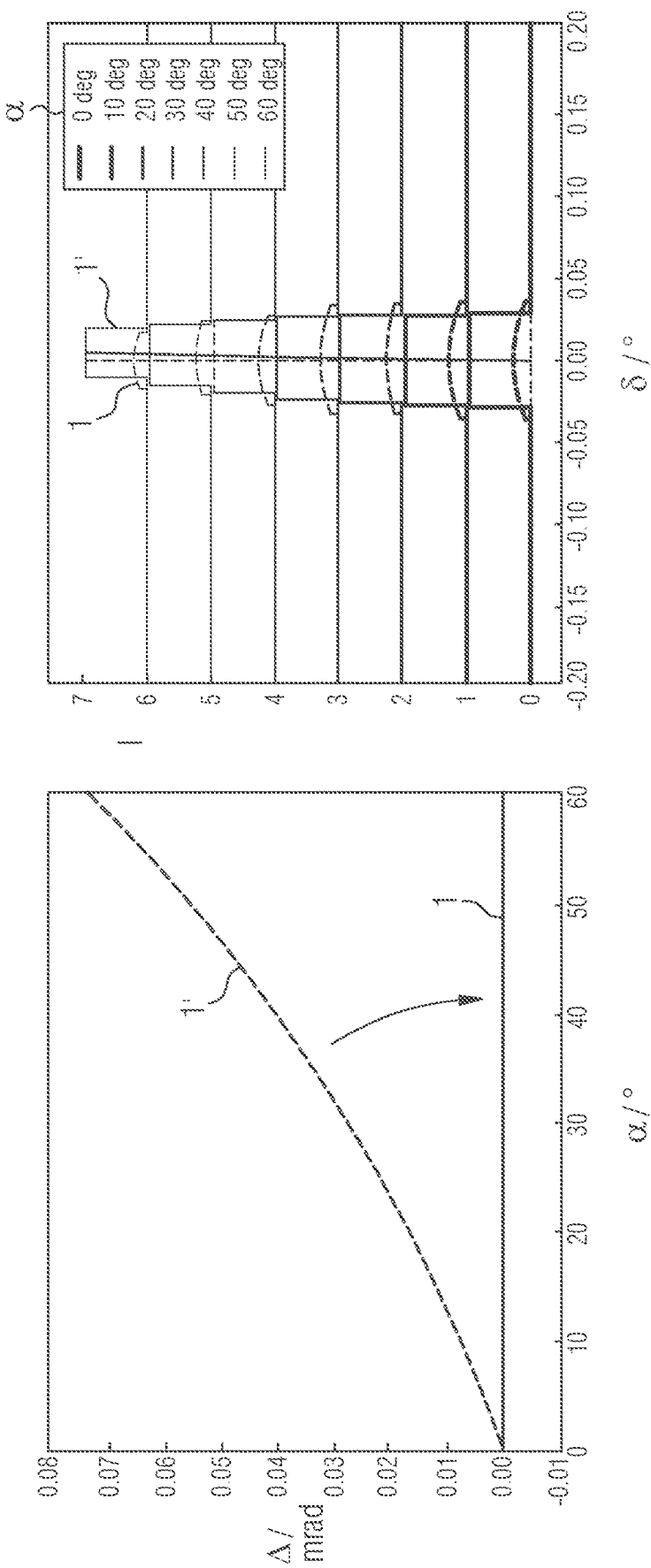

It is shown in FIG. 15D that the centroid shift Δ can be practically eliminated through the roughening 44. In contrast to the comparable example of the BPW34S detector, however, the signal strength I is relatively strongly reduced; see the right-hand side of FIG. 15D.

The components shown in the figures each follow, unless otherwise made known, preferably in the given sequence each after one another. The layers that are not in contact in the figures are preferably spaced apart from one another. Wherever lines are drawn parallel to one another, the corresponding surfaces are preferably also aligned parallel to one another. Equally, unless otherwise made known, the positions of the illustrated components relative to one another are correctly reproduced in the figures.

The invention described here is not restricted to the description based on the exemplary embodiments. The invention rather comprises any new feature or any combination of features that in particular contains any combination of features in the patent claims, even when this feature or this combination is not itself explicitly stated in the patent claims or exemplary embodiments.

The invention claimed is:

1. A sensor comprising:
   at least one sensor chip configured to detect radiation;
   at least one carrier on which the sensor chip is mounted; and
   a cast body that is transmissive for the radiation and that completely covers the sensor chip,
   wherein a centroid shift of the sensor chip amounts to at most 0.04 mrad at an angle of incidence of up to at least 60°,
   wherein the cast body comprises a light inlet side that faces away from the sensor chip, and the light inlet side comprises side walls bounding it on all sides,
   wherein the side walls are smooth, planar and transmissive for the radiation,
   wherein a free field-of-view on the light inlet side has an aperture angle of at least 140°,
   wherein the sensor chip is contacted electrically with at least one bond wire, and
   wherein the cast body protrudes in a direction away from the sensor chip beyond the bond wire by at most 120 μm so that a thickness of the cast body at the side that faces away from the sensor chip lies at a maximum of 0.2 mm and so that the thickness is smaller than a thickness of the sensor chip.

2. The sensor according to claim 1, wherein the cast body extends beyond the sensor chip equally all around when seen from above, and wherein a ratio of a diagonal length of the cast body and of the sensor chip lies between 1.1 and 1.4 inclusive.

3. The sensor according to claim 1, wherein the light inlet side is smooth and planar, and wherein an angle between the side walls and the light inlet side, seen in cross-section, is between 94° and 106° inclusive.

4. The sensor according to claim 1, wherein the sensor chip is contacted electrically at an upper chip side that faces away from the carrier with the bond wire, and wherein the bond wire is located entirely in the cast body.

5. The sensor according to claim 1, wherein the sensor chip comprises a plurality of electrical contact points at the side that faces away from the carrier, and wherein the electrical contact points are arranged symmetrically around the side of the sensor chip.

6. The sensor according to claim 1, wherein the carrier and the cast body are flush against one another at the sides, and wherein chip side walls of the sensor chip are not transmissive for the radiation and/or do not supply any contribution to a detector signal.

7. The sensor according to claim 1, wherein the centroid shift of the sensor chip amounts to at most 0.15 mrad at angles of incidence of up to at least 40°, wherein the centroid shift depends on the angle of incidence and up to angles of incidence of at least 60° are approximatable by a quadratic function with an error of at most 0.003 mrad, and wherein the centroid shift at small angles of incidence has a different arithmetic sign than at large angles of incidence, and a boundary between small and large angles of incidence lies between 7° and 25° inclusive.

8. The sensor according to claim 1, wherein the side of the cast body that faces away from the sensor chip is roughened so that the sensor chip is configured to receive a Lambertian propagation of the radiation as a result of the roughening, and wherein the cast body is made of a material that is clear for the radiation.

9. The sensor according to claim 1, wherein the carrier is designed to reflect diffusely in regions next to the sensor chip up to a surface proportion of at least 90%.

10. A 3D position detection system comprising:
    at least one radiation source configured to generate the radiation; and a user device comprising a plurality of sensors, wherein at least one sensor of the plurality of sensors is the sensor according to claim 1,
wherein the sensors are configured to determine angles between the user device and the radiation source so that a spatial position and an alignment of the user device is ascertainable based on the angles.

11. The 3D position detection system according to claim 10, wherein each sensor chip is contacted electrically at an upper chip side that faces away from the respective carrier with bond wires, and wherein bond wires are located entirely in the cast body.

12. The 3D position detection system according to claim 10, wherein each sensor chip comprises a plurality of electrical contact points at the sides that face away from the respective carrier, and wherein the electrical contact points are arranged symmetrically around the sides of the sensor chips.

13. The 3D position detection system according to claim 10, wherein the respective carrier and the associated cast body are flush against one another at the sides, and wherein chip side walls of the respective sensor chip are not transmissive for the radiation and/or do not supply any contribution to a detector signal.

14. The 3D position detection system according to claim 10, wherein the centroid shift of the sensor chip amounts to at most 0.15 mrad at angles of incidence of up to at least 40°, wherein the centroid shift depends on the angle of incidence and up to angles of incidence of at least 60° are approximatable by a quadratic function with an error of at most 0.003 mrad, and wherein the centroid shift at small angles of incidence has a different arithmetic sign than at large angles of incidence, and a boundary between small and large angles of incidence lies between 7° and 25° inclusive.

15. The 3D position detection system according to claim 10, wherein the sides of the cast bodies that face away from the sensor chips is roughened so that the sensor chips are configured to receive a Lambertian propagation of the radiation as a result of the roughening, and wherein the cast bodies are made of a material that is clear for the radiation.

16. The 3D position detection system according to claim 10, wherein the carriers are designed to reflect diffusely in regions next to the sensor chips up to a surface proportion of at least 90%.

17. The 3D position detection system according to claim 10, wherein the user device is a pair of glasses for virtual reality with at least one display, and wherein the display is configured to display three-dimensional images.

18. A method for using the 3D position detection system according to claim 10, wherein the 3D position detection system comprises at least five of the sensor chips, the method comprising:
providing pulsed, laminar and near infra-red laser radiation;
moving the radiation over a spatial region in which the user device is located so that multiple sequentially following pulses of the laser radiation impinge on a relevant sensor chip;
detecting a temporal curve of intensity of impinging pulses by the relevant sensor chip; and
ascertaining an angle to an associated radiation source based on detecting the temporal curve of intensity.

\* \* \* \* \*

UNITED STATES PATENT AND TRADEMARK OFFICE
CERTIFICATE OF CORRECTION

PATENT NO. : 11,567,565 B2
APPLICATION NO. : 16/647193
DATED : January 31, 2023
INVENTOR(S) : Daniel Dietze It is certified that error appears in the above-identified patent and that said Letters Patent is hereby corrected as shown below:

In the Claims

Claim 11, Column 13, Line 11; delete "with bond wires".

Signed and Sealed this
Seventh Day of March, 2023

Katherine Kelly Vidal
*Director of the United States Patent and Trademark Office*